(12) United States Patent
Akiyama et al.

(10) Patent No.: US 9,508,910 B2
(45) Date of Patent: Nov. 29, 2016

(54) LED MODULE

(71) Applicants: CITIZEN HOLDINGS CO., LTD., Tokyo (JP); CITIZEN ELECTRONICS CO., LTD., Yamanashi (JP)

(72) Inventors: Takashi Akiyama, Saitama (JP); Shigehisa Watanabe, Yamanashi (JP); Hidekazu Arai, Yamanashi (JP); Yuki Ochiai, Yamanashi (JP)

(73) Assignees: CITIZEN HOLDINGS CO., LTD., Tokyo (JP); CITIZEN ELECTRONICS CO., LTD., Yamanashi (JP)

( * ) Notice: Subject to any disclaimer, the term of this patent is extended or adjusted under 35 U.S.C. 154(b) by 0 days.

(21) Appl. No.: 14/367,010

(22) PCT Filed: Dec. 20, 2012

(86) PCT No.: PCT/JP2012/083116
§ 371 (c)(1),
(2) Date: Jun. 19, 2014

(87) PCT Pub. No.: WO2013/094700
PCT Pub. Date: Jun. 27, 2013

(65) Prior Publication Data
US 2014/0367710 A1    Dec. 18, 2014

(30) Foreign Application Priority Data

Dec. 20, 2011 (JP) .................. 2011-278152
Dec. 20, 2011 (JP) .................. 2011-278153
Sep. 21, 2012 (JP) .................. 2012-208204

(51) Int. Cl.
*H01L 33/62* (2010.01)
*H01L 25/16* (2006.01)
(Continued)

(52) U.S. Cl.
CPC ............. *H01L 33/62* (2013.01); *H01L 25/167* (2013.01); *H01L 33/50* (2013.01); *H05B 33/083* (2013.01);
(Continued)

(58) Field of Classification Search
CPC ..... H01L 33/62; H01L 25/167; H01L 33/50; H01L 2924/1305; H01L 2924/13091; H01L 2224/48091; H01L 2224/48137; H01L 25/0753; H05B 33/0845; H05B 33/083
See application file for complete search history.

(56) References Cited

U.S. PATENT DOCUMENTS 6,730,933 B1    5/2004  Shimizu et al.
8,164,276 B2 *  4/2012  Kuwabara ............ H05B 33/083
                                              315/185 R
(Continued)

FOREIGN PATENT DOCUMENTS

CN    202049955 U    11/2011
EP    2723148 A1      4/2014
(Continued)

OTHER PUBLICATIONS

International Search Report for PCT/JP2012/083116, Jan. 29, 2013.
(Continued)

*Primary Examiner* — Ermias Woldegeorgis

(57) ABSTRACT

The purpose of the present invention is to reduce the size and thickness of an LED module in which a plurality of LED dies along with other electronic components are mounted on a circuit board, and at the same time to stabilize the operation of the module with respect to source voltage fluctuation. The LED module includes: a circuit board; a plurality of LED dies that are mounted on one surface of a circuit board as bare chips and constitute a series circuit; an FET die that is mounted on the one surface of a circuit board as bare chips and controls a current flowing through the plurality of LED dies; and a constant current circuit that is mounted on the one surface of a circuit board and is series-connected to the series circuit. The constant current circuit includes the FET die.

13 Claims, 8 Drawing Sheets

(51) Int. Cl.
*H01L 33/50* (2010.01)
*H05B 33/08* (2006.01)
*H01L 25/075* (2006.01)

(52) U.S. Cl.
CPC ....... *H05B 33/0845* (2013.01); *H01L 25/0753* (2013.01); *H01L 2224/48091* (2013.01); *H01L 2224/48137* (2013.01); *H01L 2924/1305* (2013.01); *H01L 2924/13091* (2013.01)

(56) References Cited

U.S. PATENT DOCUMENTS

| | | | |
|---|---|---|---|
| 8,872,445 B2 | 10/2014 | Egawa et al. | |
| 2007/0108533 A1* | 5/2007 | Sekiguchi | H01L 27/0629 257/379 |
| 2010/0194298 A1 | 8/2010 | Kuwabara | |
| 2010/0320483 A1 | 12/2010 | Kadotani et al. | |
| 2011/0037082 A1* | 2/2011 | Doan | H05B 33/0815 257/89 |
| 2011/0180817 A1 | 7/2011 | Ishizaki et al. | |
| 2011/0316420 A1 | 12/2011 | Chang et al. | |
| 2013/0234609 A1 | 9/2013 | Akiyama | |
| 2014/0292218 A1* | 10/2014 | Vos | H05B 33/0815 315/193 |

FOREIGN PATENT DOCUMENTS

| | | | |
|---|---|---|---|
| JP | H10-209338 A | | 8/1998 |
| JP | 2001-68742 A | | 3/2001 |
| JP | 3261280 B2 | | 2/2002 |
| JP | 2007-157690 A | | 6/2007 |
| JP | 2010-080796 A | | 4/2010 |
| JP | 2010-92997 A | | 4/2010 |
| JP | 2010092997 A | * | 4/2010 |
| JP | 2010-109168 A | | 5/2010 |
| JP | 3162764 U | | 9/2010 |
| JP | 2010200428 A | * | 9/2010 |
| JP | 2011-9298 A | | 1/2011 |
| JP | 2011-14860 A | | 1/2011 |
| JP | 2011-134903 A | | 7/2011 |
| JP | 2011134903 A | * | 7/2011 |
| JP | 2011-151268 A | | 8/2011 |
| WO | 2010/098174 A1 | | 9/2010 |
| WO | 2011/105630 A1 | | 9/2011 |

OTHER PUBLICATIONS

Japan Patent Office, Office Action for Japanese Patent Application No. 2013-138063, Apr. 15, 2014.
European Patent Office, Extended European Search Report for EP Patent Application No. 12859089.0, Jul. 10, 2015.
Written Opinion of the International Searching Authority for PCT/JP2012/083116, Jan. 29, 2013.
European Patent Office, Office Action for EP Patent Application No. 12859089.0, May 31, 2016.

* cited by examiner

LED MODULE

TECHNICAL FIELD

The present invention relates to an LED module constructed by mounting a plurality of LEDs on a circuit substrate along with other electronic components.

BACKGROUND

Lighting equipment using LEDs has come into wide use. Under the circumstances, if it is desirable to shorten the design lead time for lighting equipment such as desk lamps and other lighting lamps, then light source units should be modularized. For example, FIG. 3 in patent document 1 shows an LED module constructed by mounting a plurality of LED chips and a driver circuit on the same substrate.

FIG. 10 is a cross-sectional view of an LED lamp that uses a lamp base (GX53 type) conforming to the IEC standard, and corresponds to FIG. 3 in patent document 1.

In FIG. 10, the LED module comprises a circuit substrate 2, a driver circuit 4, and LEDs 3. The driver circuit 4 is mounted on the upper surface of the circuit substrate 2, while the LEDs 3 are mounted on the lower surface of the circuit substrate 2. The LED module is fitted into the housing of a lamp base 1, and is held in place by means of a lamp cover case 5. If reducing the thickness of the module is desirable, the LEDs 3 should be mounted using a technology known as COB (Chip on Board). COB is a technology that mounts bare-chip LEDs (hereinafter called the LED dies unless specifically designated otherwise) directly on the circuit substrate 2.

PRIOR ART DOCUMENT

Patent Document

Patent document 1: Japanese Unexamined Patent Publication No. 2007-157690 (FIG. 3)

SUMMARY

In the LED module shown in FIG. 10, the driver circuit 4 and the LEDs 3 are combined into one unit by mounting the driver circuit 4 on one side of the circuit substrate 2 and the LEDs 3 on the other side. Patent document 1 also suggests that the thickness of the module can be reduced by mounting the LEDs 3 using the COB technology. However, if the LED dies and the driver circuit can be mounted only on one side of the circuit substrate, the thickness can be further reduced. In this case, the driver circuit must be reduced in size because the available mounting space is limited. However, if the driver circuit is a simple low-performance construction, for example, a single resistor, stable operation cannot be guaranteed in the presence of supply voltage fluctuations.

Further, when the LED dies and the bare-chip integrated circuit are mounted on the same side of the circuit substrate, a dam is formed so as to enclose the mounting region of the LED dies, and a fluorescent resin is filled into the space inside the dam to cover the LED dies. Furthermore, a dam is also formed so as to enclose the mounted integrated circuit, and a mold material is filled into the space inside the dam to cover the integrated circuit. That is, the fabrication process of the LED module involves the mounting and covering of the LED dies and the mounting and covering of the integrated circuit, and hence the problem that the number of fabrication steps increases.

Accordingly, it is an object of the present invention to provide an LED module that can resolve the above problem.

It is also an object of the present invention to provide an LED module which is constructed by mounting a plurality of LED dies on a circuit substrate along with other electronic components, and in which provisions are made to reduce the size and thickness of the module by mounting the LED dies and other electronic components on the same side of the circuit substrate and, at the same time, to ensure stable operation irrespective of supply voltage fluctuations.

It is a further object of the present invention to provide an LED module which is constructed by mounting a plurality of LED dies on a circuit substrate along with other electronic components, and in which provisions are made so as not to increase the number of fabrication steps even when the LED dies and bare-chip semiconductor devices are mounted on the same side of the circuit substrate.

Provided is an LED module includes a circuit substrate, a plurality of LED dies mounted directly in bare chip form on one surface of the circuit substrate and arranged so as to form a series circuit, an FET die, mounted directly in bare chip form on the one surface of the circuit substrate, for limiting current flowing through the plurality of LED dies, and a constant current circuit mounted on the one surface of the circuit substrate and connected in series with the series circuit, wherein the constant current circuit includes the FET die.

Preferably, the LED module further includes a bypass circuit connected to an intermediate terminal provided on the series circuit, and the bypass circuit includes the FET die.

Preferably, in the LED module, the FET die is a depletion-mode device.

Preferably, the LED module further includes a supply terminal for supplying to the circuit substrate a rectified waveform voltage derived from a commercial AC power supply.

Preferably, the LED module further includes a dimmer circuit, mounted on the one surface of the circuit substrate, for controlling the amount of light to be emitted from the plurality of LED dies.

There is also provided an LED module which includes a circuit substrate, a plurality of LED dies mounted directly in bare chip form on one surface of the circuit substrate and arranged so as to form a series circuit, an FET die, mounted directly in bare chip form on the one surface of the circuit substrate, for limiting current flowing through the plurality of LED dies, and a dimmer circuit, mounted on the one surface of the circuit substrate, for controlling the amount of light to be emitted from the plurality of LED dies.

Preferably, the LED module further includes a resistor network mounted directly in bare chip form on the one surface of the circuit substrate.

There is also provided an LED module which includes a circuit substrate, a plurality of LED dies mounted directly in bare chip form on one surface of the circuit substrate and arranged so as to form a series circuit, an FET die, mounted directly in bare chip form on the one surface of the circuit substrate, for limiting current flowing through the plurality of LED dies, and a resistor network mounted directly in bare chip form on the one surface of the circuit substrate.

Preferably, in the LED module, the resistor network contains a protective resistor and a current sensing resistor.

Preferably, in the LED module, the current sensing resistor is provided with a bonding option pad.

Preferably, in the LED module, the bonding option pad includes a pad connecting to an intermediate portion of a band-like resistive element and a pad connecting to an end portion of the band-like resistive element.

Preferably, the LED module further includes a dam formed on the circuit substrate so as to enclose an LED block region where the plurality of LED dies are mounted and a circuit block region where the FET die is mounted and so as to separate the LED block region from the circuit block region, and a fluorescent resin for covering the LED block region and the circuit block region.

There is also provided an LED module which includes a circuit substrate, a plurality of LED dies mounted directly in bare chip form on one surface of the circuit substrate and arranged so as to form a series circuit, an FET die, mounted directly in bare chip form on the one surface of the circuit substrate, for limiting current flowing through the plurality of LED dies, a dam formed on the circuit substrate so as to enclose an LED block region where the plurality of LED dies are mounted and a circuit block region where the FET die is mounted and so as to separate the LED block region from the circuit block region, and a fluorescent resin for covering the LED block region and the circuit block region.

Preferably, in the LED module, a portion of the dam enclosing the LED block region forms a portion of the dam enclosing the circuit block region.

In the LED module, since the LED dies and the current limiting FET die are mounted on the same surface of the circuit substrate, not only can the size and thickness of the module be reduced, but stable operation can also be achieved.

In the LED module, since the same fluorescent resin is used as the material for covering the LED dies and the bare-chip semiconductor devices, the number of fabrication steps can be reduced.

DESCRIPTION

Figure 1:
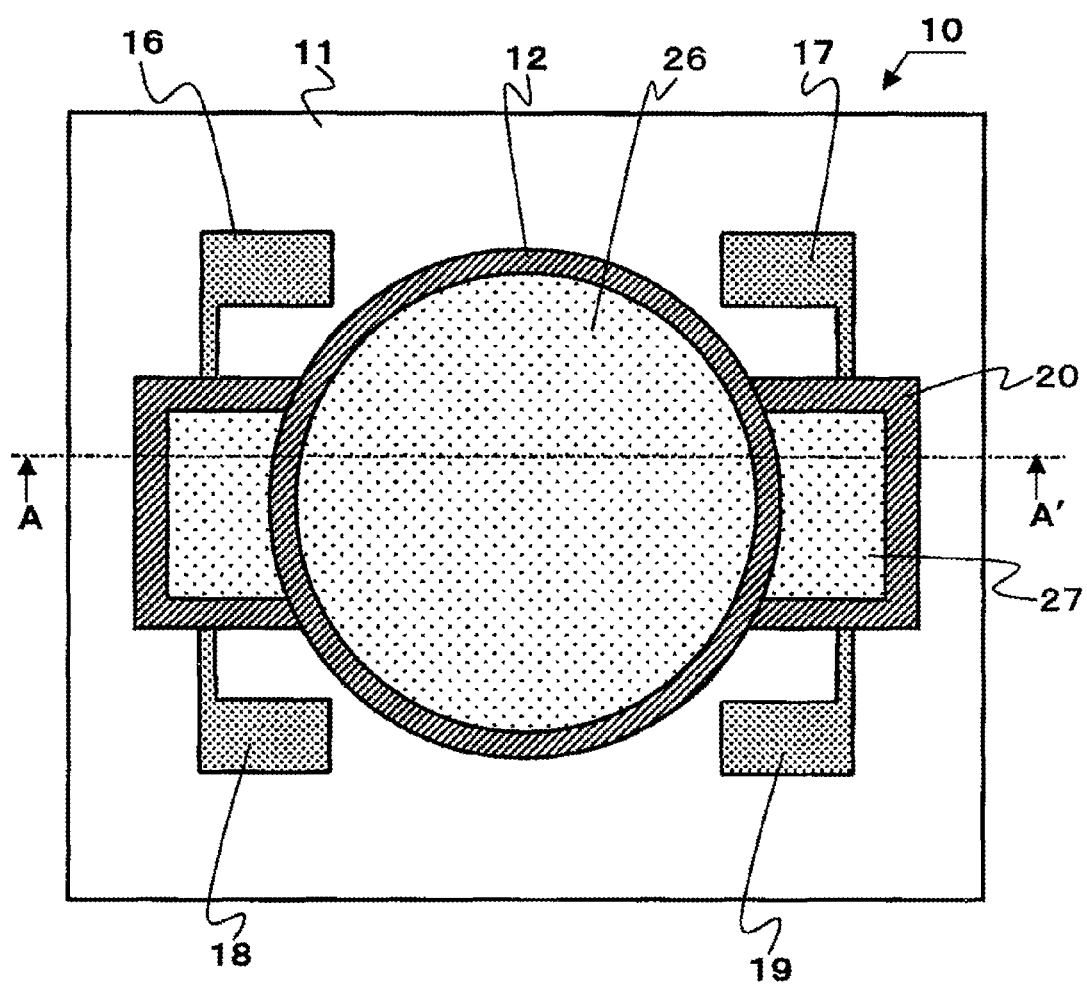
FIG. 1 is a top plan view of an LED module 10.

LED modules will be described below with reference to the drawings. It will, however, be noted that the technical scope of the present invention is not limited by any particular embodiment described herein but extends to the inventions described in the appended claims and their equivalents. Further, in the description of the drawings, the same or corresponding component elements are designated by the same reference numerals, and the description of such component elements, once given, will not be repeated thereafter.

It will also be noted that the scale to which each component element is drawn is changed as needed for illustrative purposes.

FIG. 1 is a top plan view of an LED module 10.

As shown in FIG. 1, a circular dam 12 and a rectangular dam 20 lacking one side are formed on a circuit substrate 11. The region inside the dam 12 is filled with a mold material 26, and the region enclosed by the dams 12 and 20 is filled with a mold material 27. The region enclosed by the dams 12 and 20 is actually two regions, one at the left and the other at the right in the figure. Source terminal electrodes 16 and 17, a negative electrode 18, and a positive electrode 19 are also formed on the circuit substrate 11.

Figure 2:
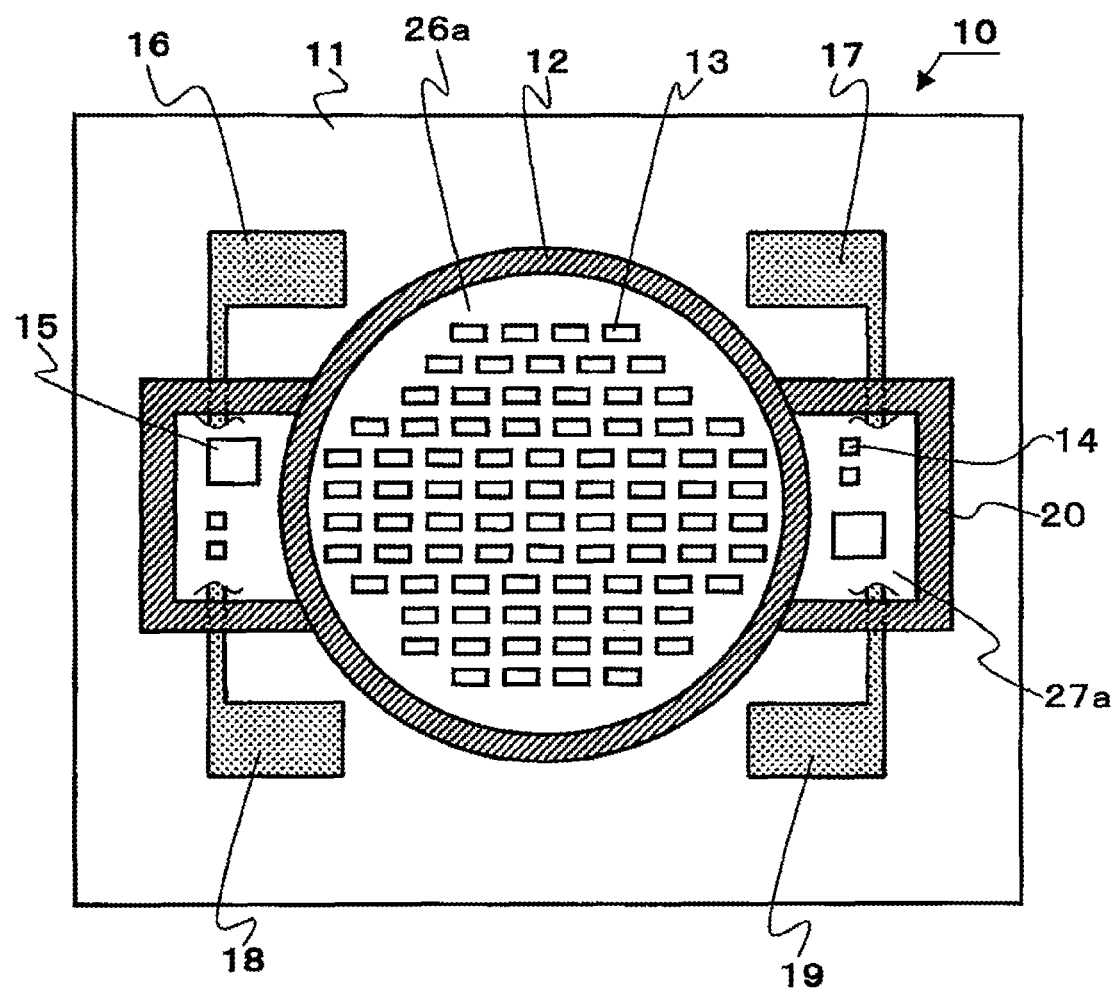
FIG. 2 is a top plan view of the LED module 10 from which a fluorescent resin has been removed.

FIG. 2 is a top plan view of the LED module 10 from which a fluorescent resin (the mold materials 26 and 27) has been removed. In FIG. 2, metal interconnects formed on the circuit substrate 11 are not shown, except where needed. Further, connecting wires are not shown in FIG. 2.

As shown in FIG. 2, eighty-three LED dies 13, two FET dies 15 (bare-chip FETs), and four resistors 14 are mounted on the circuit substrate 11. An LED block 26a as the mounting region of the LED dies 13 is enclosed by the circular dam 12. Left and right circuit blocks 27a on which the FET dies 15 and resistors 14 are mounted are each enclosed by an arc of the dam 12 and portions of the rectangular dam 20. The negative electrode 18, the positive electrode 19, and the source terminal electrodes 16 and 17 are formed on the circuit substrate 11. The metal interconnects (not shown except those associated with the source terminal electrodes 16 and 17, the negative electrode 18, and the positive electrode 19) on the circuit substrate 11 are formed only on the upper surface, and no through-holes are formed in the circuit substrate 11.

The size of each LED die 13 is 500 µm×290 µm, the size of each FET die 15 is 1.5 mm×1.5 mm, and the size of each resistor 14 is 500 µm×500 µm; these components are die-bonded to the metal interconnects not shown on the circuit substrate 11. The source terminal electrodes 16 and 17, the negative electrode 18, the positive electrode 19, and the metal interconnects not shown are each formed by depositing Ni, Pd, and Au one on top of another on Ag. The dams 12 and 20 are each formed from a silicone resin, and each has a width of 0.7 to 1.00 mm and a height of 0.5 to 0.7 mm.

The mold material 26 used to cover the LED dies 13 is an optically transmissive material such as a silicone resin containing phosphors, and the mold material 27 used to cover the FET dies 15 and resistors 14 is a black resin or the same optically transmissive material containing phosphors. The mold materials 26 and 27 are each formed with a thickness of about 400 to 800 µm. The thickness of the mold material 26 must be controlled strictly, since any variation in thickness can cause a shift in chromaticity; on the other hand, the thickness of the mold material 27 may not be controlled so precisely. When a fluorescent resin was used as the mold material 27 for the FET dies 22, no incorrect operation occurred due to light.

Next, a fabrication method for the LED module 10 will be described with reference to FIGS. 1 to 3.

First, the LED dies 13, FET dies 15, and resistors 14 are die-bonded to the circuit substrate 11 and thereafter wire-bonded. Next, a curable material for forming the dams 12 and 20 is dispensed using a dispenser, and cured at about 150° C. to form the dam members 12 and 20. Since the thickness of the mold material 26 to be formed in the LED block 26a must be controlled strictly, as described above, the outer dimensions of the dam 12 must also be controlled highly precisely. On the other hand, the dimensions of the dam 20 may not be controlled so precisely. Next, the same phosphor-containing silicone resin is applied as the mold materials 26 and 27 over the LED block 26a and the circuit blocks 27a by using a dispenser. Finally, the silicone resin is cured by sintering to complete the fabrication of the LED module 10. Preferably, the sintering temperature of the silicone resin is about 150° C., and the thickness variation of the mold material 26 after sintering is held to within 100 μm.

Figure 3:
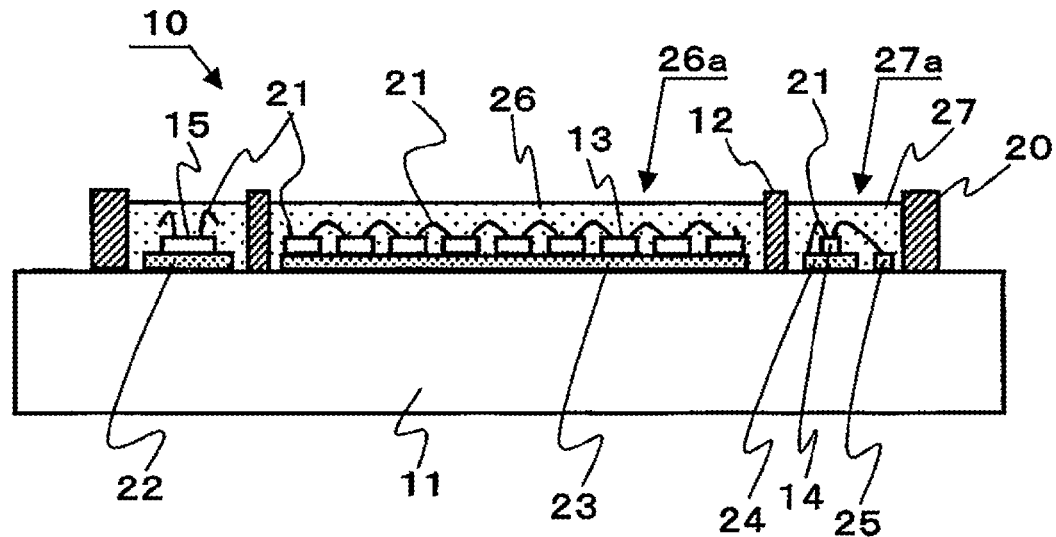
FIG. 3 is a cross-sectional view taken along line AA' in FIG. 1.

FIG. 3 is a cross-sectional view taken along line AA' in FIG. 2.

The electrical connections of the devices will be described below with reference to FIG. 3. In FIG. 3, wires 21 and metal interconnects 22, 23, 24, and 25 are also shown. The metal interconnects 22, 23, 24, and 25 are formed on the circuit substrate 11, and the FET dies 15, LED dies 13, and resistors 14 are die-bonded to the metal interconnects 22, 23, and 24, respectively.

The FET dies 15, the LED dies 13, and the resistors 14 are separated by the dam members 12 and 20. The LED block 26a and the circuit blocks 27a, separated by the dams 12 and 20, are filled with the mold materials 26 and 27 to cover the FET dies 15, the LED dies 13, and the resistors 14. The bottom face of each FET die 15 is the drain, and wires 21 are attached to the gate and source. The gate is connected to its adjacent resistor 14 (see FIG. 2) by one wire 21, and the source is connected to the source terminal electrode 16 (see FIG. 2) by the other wire 21.

The cathode of each LED die 13 is connected by a wire 21 to the anode of the LED die 13 adjacent thereto on one side, and its anode is connected by another wire 21 to the LED die 13 adjacent thereto on the other side. The leftmost and rightmost LED dies 13 are connected by wires 21 to the LED dies 13 adjacent thereto perpendicular to the plane of FIG. 3. Each resistor 14 is connected by a wire 21 to the metal interconnect 24 connecting to the source terminal electrode 16 (see FIG. 2) and by another wire 21 to the metal interconnect 25 connecting to the source terminal electrode 17 (see FIG. 2). The bottom face of each LED die 13 and the bottom face of each resistor 14 are insulated.

Figure 4:
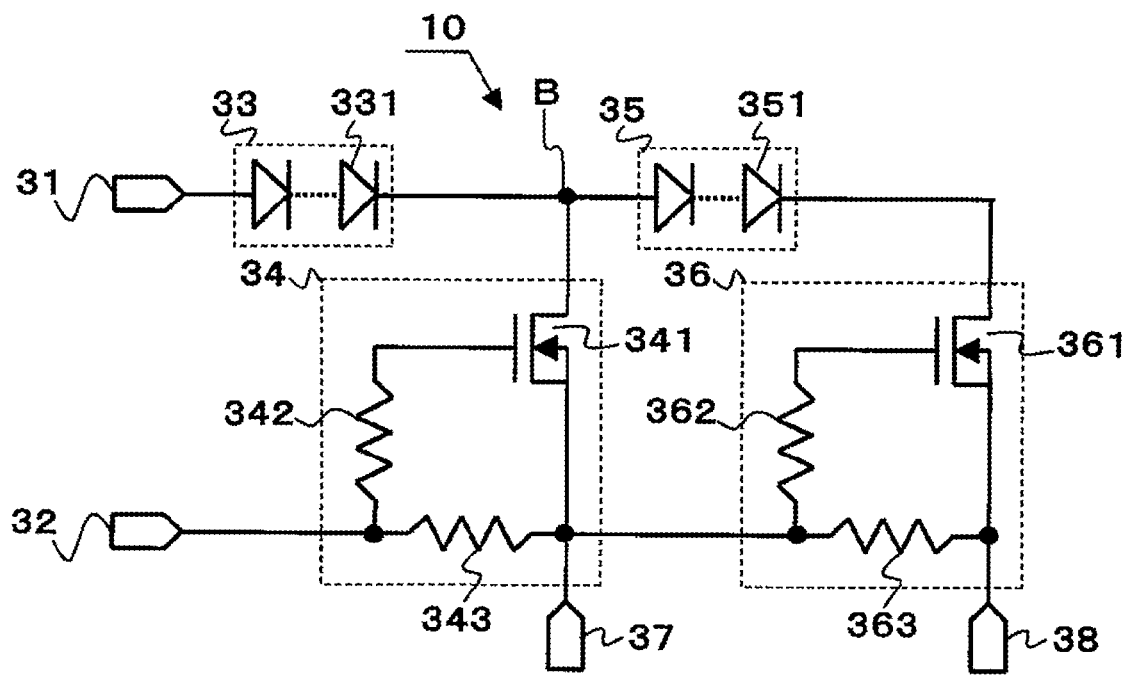
FIG. 4 is a circuit diagram of the LED module 10.

FIG. 4 is a circuit diagram of the LED module 10.

The LED module 10 comprises a positive terminal 31, a negative terminal 32, source terminals 37 and 38, LED arrays 33 and 35, a bypass circuit 34, and a constant current circuit 36. The positive terminal 31, the negative terminal 32, and the source terminals 37 and 38 respectively correspond to the positive electrode 19, the negative electrode 18, and the source terminal electrodes 16 and 17 in FIG. 2.

The LED array 33 is constructed from a series of fifty-two connected LED dies 331, while the LED array 35 is constructed from a series of thirty-one connected LED dies 351. The LED arrays 33 and 35 are connected in series to form a series circuit in which all the LEDs are connected in series. In the combined LED array, the node connecting between the cathode of the LED array 33 and the anode of the LED array 35 forms an intermediate terminal B. The bypass circuit 34 is connected to the intermediate node B, while the constant current circuit 36 is connected to the cathode of the series circuit.

The bypass circuit 34 comprises a depletion-mode FET die 341 and resistors 342 and 343, and likewise, the constant current circuit 36 comprises a depletion-mode FET die 361 and resistors 362 and 363. In FIG. 4, the LED dies 331 and 351, the FET dies 341 and 361, and the resistors 342, 343, 362, and 363 respectively correspond to the LED dies 13, the FET dies 15, and the resistors 14 in FIG. 2. The resistors 342 and 343 are resistors for surge and noise protection, while the resistors 343 and 363 are current sensing resistors.

Next, the circuit operation of the LED module 10 shown in FIG. 4 will be described.

A pulsating waveform such as a half-wave or full-wave rectified waveform is applied across the positive and negative terminals 31 and 32. When the pulsating voltage is higher than the threshold value of the LED array 33 but lower than the threshold value of the series circuit of the LED array 33 and 35, the current flowing through the LED array 33 passes through the FET die 341 and flows toward the negative terminal 32. At this time, the voltage drop across the resistor 343 is fed back to the gate of the FET die 341 through the resistor 342, thus limiting the current flowing to the FET die 341. When the forward voltage drop of each LED die 331 is 3.0 V, the threshold value of the LED array 33 is given as 3.0 (V)×52 (pieces)=156 (V). Similarly, the threshold value of the LED array 35 is 93 V.

When the pulsating voltage exceeds the threshold value (249 V) of the series circuit of the LED arrays 33 and 35, current also begins to flow through the LED array 35. When the pulsating voltage is slightly higher than the threshold value of the series circuit of the LED arrays 33 and 35, feedback is applied to the FET die 341 so that the sum of the current flowing to the FET die 341 and the current flowing to the FET die 361 is maintained constant. When the pulsating voltage becomes sufficiently higher than the threshold value of the series circuit of the LED arrays 33 and 35, the current flowing through the LED array 35 increases and the FET die 341 is cut off. At this time, in the constant current circuit 36, the voltage drop across the resistor 363 is fed back to the gate of the FET die 361 through the resistor 362, thus limiting the current flowing to the FET die 361.

Figure 5:
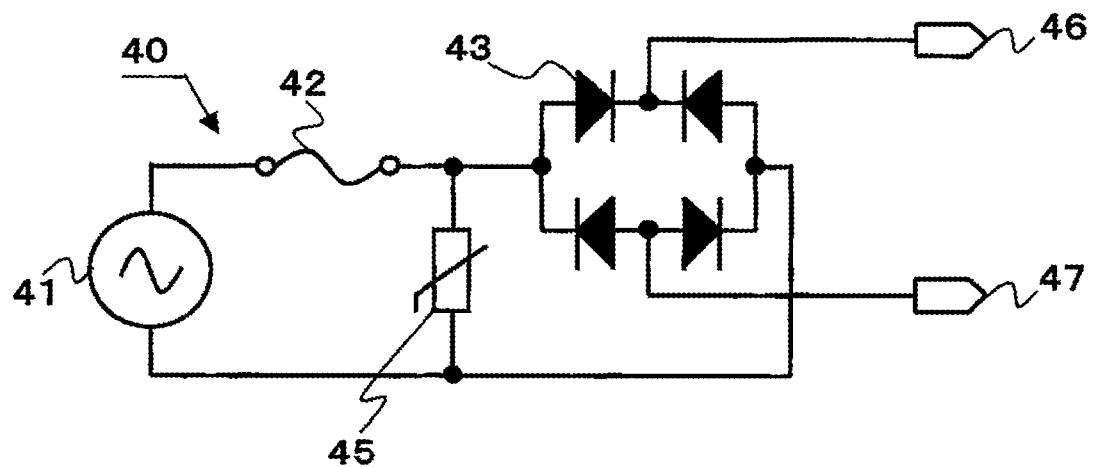
FIG. 5 is a circuit diagram of an external circuit 40 for driving the LED module 10.

FIG. 5 is a circuit diagram of an external circuit 40 for driving the LED module 10.

The external circuit 40 includes a fuse 42, a surge absorber 45, and four diodes 43, and is connected to a commercial AC power supply 41. The fuse 42 and the surge absorber 45 together constitute a safety circuit, and the four diodes 43 form a diode bridge. The diode bridge circuit outputs a full-wave rectified waveform at its terminals 46 and 47. The terminal 46 is a positive power output terminal, which is connected via a lead wire to the positive electrode 19 (the positive terminal 31 in FIG. 4) of the LED module 10 shown in FIG. 2. Similarly, the terminal 47 is a negative power output terminal, which is connected via a lead wire to the negative electrode 18 (the negative terminal 32 in FIG. 4) of the LED module 10.

The source terminal electrodes 16 and 17 of the LED module 10 are terminals provided for connecting a dimmer circuit, as will be described later. In the LED module 10, the FET dies 15 (the FET dies 341 and 361 in FIG. 4) and the resistors 14 (the resistors 343 and 363 in FIG. 4), as well as the LED dies 13 (the LED dies 331 and 351 in FIG. 4), generate heat during operation; therefore, the whole of the circuit substrate 11 is constructed to have a good thermal conduction. Since the LED dies 13, the FET dies 15, and the resistors 14 are all die-bonded to the circuit substrate 11, efficient heat dissipation can be achieved by enhancing the thermal conductivity of the whole structure of the circuit substrate 11.

In the circuit of the LED module 10 shown in FIG. 4, the bypass circuit 34 and the constant current circuit 36 are identical in structure. That is, the bypass circuit 34 and the constant current circuit 36 are both current limiting circuits. Further, the bypass circuit 34 and the constant current circuit 36 are constructed using the depletion-mode FET dies 341 and 361, respectively. When a depletion-mode FET is used for the construction of a current limiting circuit, essentially only one resistor need be provided as the additional device. For example, in the case of the constant current circuit 36, the FET die 361 and the resistor 363 will suffice. The resistors 342 and 362 can be omitted since they are inserted as protective resistors for preventing breakage or incorrect operation due to a surge or noise. Since the current limiting circuits can be simplified in structure in this way, the circuit of the LED module 10 can be constructed by providing metal interconnects only on the upper surface of the circuit substrate 11.

As shown in FIG. 3, in the LED module 10, the LED dies 13, the FET dies 15, and the resistors 14 are mounted by die bonding (also referred to as face-up mounting). As is well known, the LED dies and FET dies may be mounted using flip-chip technology (also referred to as face-down mounting). In the flip-chip mounting, the mounting area can be reduced, and heat dissipation efficiency as well as light-emitting efficiency improves. On the other hand, the resistors may be mounted by reflow soldering.

Further, in the LED module 10, the LED arrays 33 and 35 are each constructed by connecting the individual LED dies 331 or 351 in series. However, the LED dies need not be limited to the type in which one light-emitting diode is formed on each die, but use may be made of LED dies of the integrated type in which a plurality of light-emitting diodes are formed on each die.

Figure 6:
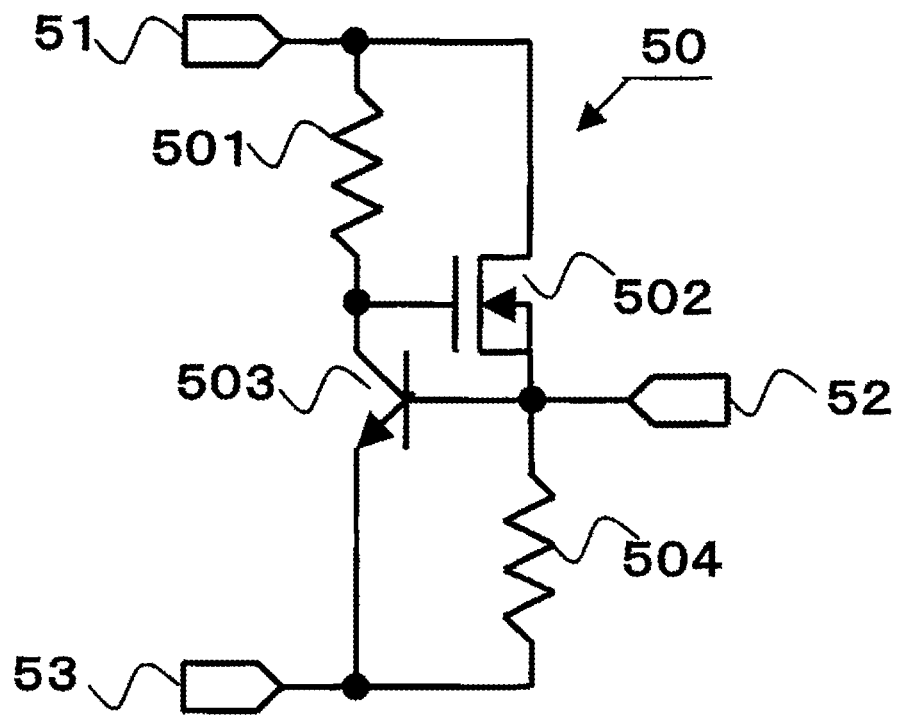
FIG. 6 is a circuit diagram showing an alternative current limiting circuit 50.

FIG. 6 is a circuit diagram showing an alternative current limiting circuit 50.

The current limiting circuit 50 shown in FIG. 6 can be used to replace the bypass circuit 34 or constant current circuit 36 in the LED module 10 shown in FIGS. 2 to 4 when the depletion-mode FETs that match the desired characteristics are not available.

The current limiting circuit 50 comprises terminals 51, 52, and 53, resistors 501 and 504, an enhancement-mode n-type MOSFET die 502, and an NPN bipolar transistor 503. The terminals 51, 52, and 53 of the current limiting circuit 50 respectively correspond to the drain terminal and source terminal of the FET die 341 and the negative terminal of the resistor 343 in the bypass circuit 34 shown in FIG. 4. The current limiting circuit 50 limits the current flowing to the FET die 502 so that the base-emitter voltage of the transistor 503 is maintained constant at 0.6 V, and operates so as to cut off the FET die 502 when a large amount of current flows through the terminal 52. When using the current limiting circuit 50 as the constant current circuit, the terminal 52 is left open.

Figure 7:
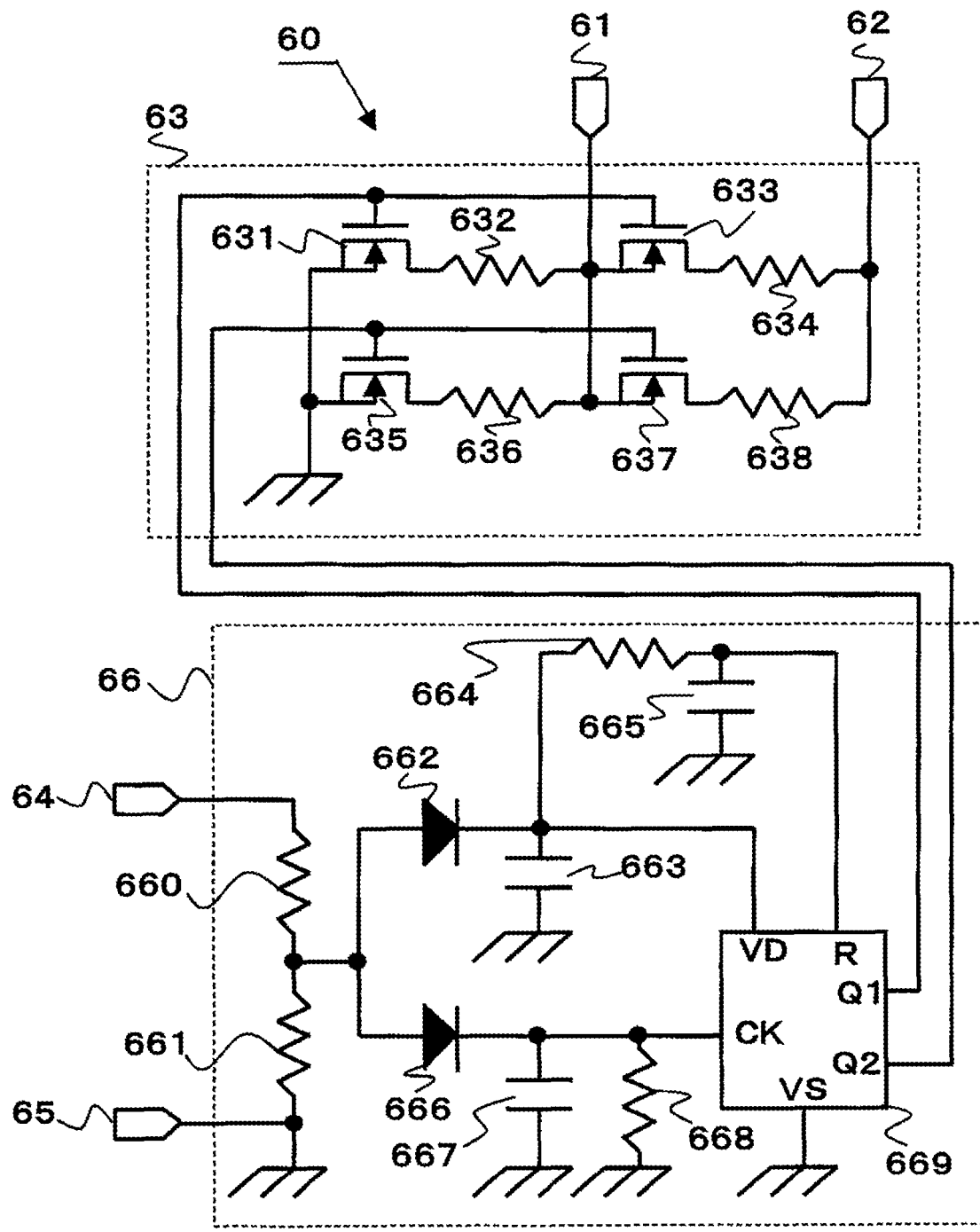
FIG. 7 is a circuit diagram of a dimmer circuit 60.

FIG. 7 is a circuit diagram of a dimmer circuit 60.

As previously shown in FIG. 2, the LED module 10 includes the source terminal electrodes 16 and 17 on the circuit substrate 11, and the source terminal electrodes 16 and 17 are terminals provided for connecting a multi-level dimmer circuit. Multi-level dimming means switching the intensity of light emission in multiple steps in response to the ON/OFF operation of the power supply. In order to enhance the functionality of the LED module, the multi-level dimmer circuit 60 may be mounted on the circuit substrate together with the circuit of the LED module 10 shown in FIG. 4. The dimmer circuit 60 will be described below in conjunction with the circuit diagram of the LED module 10 shown in FIG. 4.

The dimmer circuit 60 comprises terminals 61, 62, 64, and 65, a power supply control circuit 66, and a switch circuit 63. The terminals 61, 62, 64, and 65 are respectively connected to the source terminals 37 and 38, the positive terminal 31, and the negative terminal 32 in the circuit of the LED module 10 shown in FIG. 4.

In the power supply control circuit 66, resistors 660 and 661 act to reduce the pulsating voltage applied across the terminals 64 and 65. A diode 662 and a capacitor 663 smooth and hold the reduced pulsating voltage, which is supplied to the positive power supply terminal VD of a counter 669. A resistor 664 and a capacitor 665 together constitute a reset circuit. The resistor 664 and capacitor 665 are set so as to ignore the ON/OFF of the pulsating power supply with a short time constant, and reset the counter 669 only when the power supply is turned off for a longer time and thereafter the first pulsating voltage is supplied. The circuit comprising a diode 666, capacitor 667, and resistor 668 generates an impulse when the pulsating power is interrupted for a short time and then restored, and supplies the generated impulse to the clock terminal CK of the counter 669.

In the switch circuit 63, enhancement-mode re-type MOSFET dies 631, 633, 635, and 637 are set so as to switch between conducting and nonconducting, depending on the states of the output terminals Q1 and Q2 of the counter 669. First, when the output terminals Q1 and Q2 of the counter 669 are both low, the LED dies 631, 633, 635, and 637 are all set in a nonconducting state. In this case, the brightness of the LED arrays 33 and 35 contained in the circuit of the LED module 10 shown in FIG. 4 is determined by the values of the resistors 343 and 363.

When the pulsating power is momentarily interrupted and then restored in a short time, the output terminal Q1 of the counter 669 goes high, and the output terminal Q2 remains at the low level, thus setting the FET dies 631 and 633 in a conducting state. In this case, the bypass circuit 34 limits the current by the resistance value determined by the parallel circuit of the resistors 343 and 632, while the constant current circuit 36 limits the current by the resistance value determined by the parallel circuit of the resistors 363 and 634. As a result, the amount of current flowing through the LED arrays 33 and 35 in the circuit of the LED module 10 shown in FIG. 4 increases and the brightness thus increases.

Then, when the pulsating power is momentarily interrupted and then restored in a short time, the output terminals Q1 and Q2 of the counter 669 both go high, thus setting the FET dies 631, 633, 635, and 637 in a conducting state. In this case, the bypass circuit 34 limits the current by the resistance value determined by the parallel circuit of the resistors 343, 632, and 636. On the other hand, the constant current circuit 36 limits the current by the resistance value determined by the parallel circuit of the resistors 363, 634, and 638. As a result, the amount of current flowing through the LED arrays 33 and 35 in the circuit of the LED module 10 shown in FIG. 4 increases and the brightness thus increases to a maximum.

Further, when the pulsating power is momentarily interrupted and then restored in a short time, the output terminals Q1 and Q2 of the counter 669 both go low, thus returning to the initial state.

As described above, the dimmer circuit 60 is configured to control the light output in three steps, but if the design of the counter 669 is changed, and the values of the resistors 632, 634, 636, and 638 are adjusted, it is also possible to control the light output in four steps. The counter 669 can be easily constructed by combining commercially available C-MOS logic ICs, but it is desirable that the ICs be bare chips if they are to be mounted on the circuit substrate. While the dimmer circuit 60 has been described as controlling the light output in multiple steps, the circuit may be configured to control the light output in a continuous manner. In this case, the resistors 632 and 636 and FET dies 631 and 635 in the switch circuit 63 are replaced by a single variable resistor (while also replacing the resistors 634 and 638 and FET dies 633 and 637 by a single variable resistor), and a control signal is sent by radio or like means so that the light output is controlled by adjusting the variable resistors under the control of a microcomputer.

Figure 8:
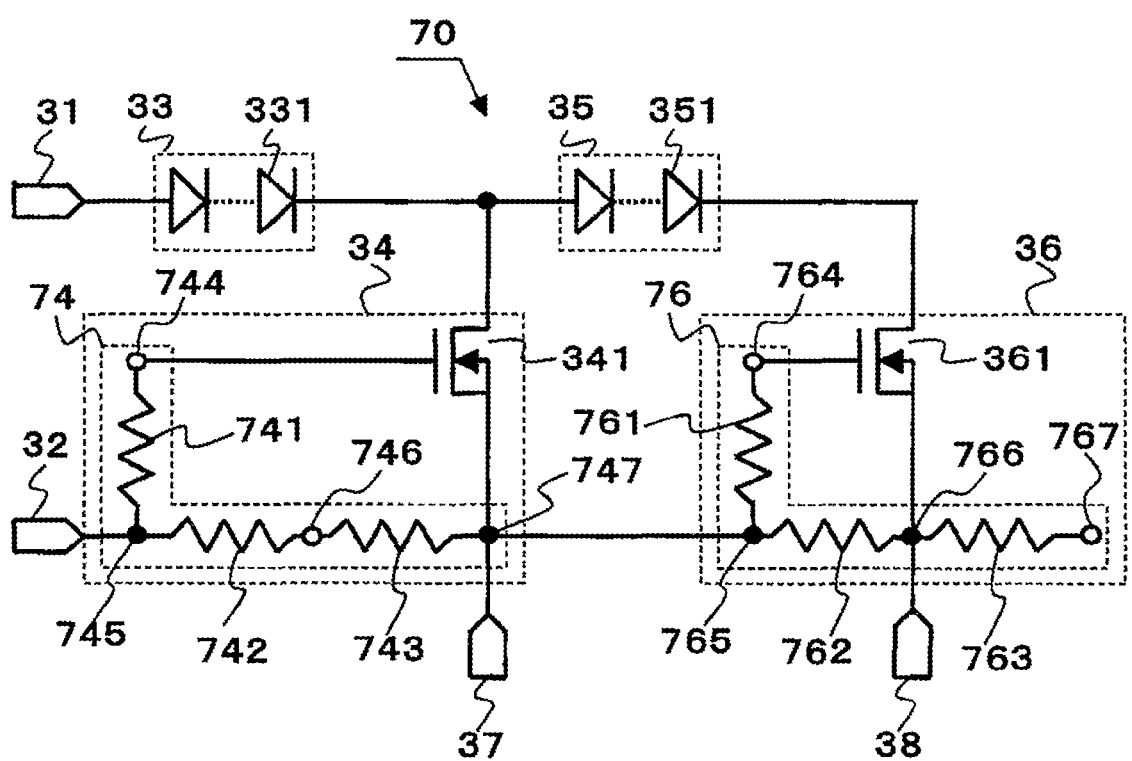
FIG. 8 is a circuit diagram showing an alternative LED module 70.

FIG. 8 is a circuit diagram showing an alternative LED module 70.

Generally, when using a plurality of resistors, the size of the final product may be reduced by replacing the resistors by a resistor network. For example, as shown in FIG. 4, the LED module 10 contains the resistors 342 and 343 in the vicinity of the FET die 341. By contrast, the LED module 70 described hereinafter uses a resistor network in place of such resistors.

In FIG. 8, the components, terminals, and circuit blocks identical or corresponding to the components, terminals, and circuit blocks shown in FIG. 4 will be designated by the same reference numerals and will not be further described herein.

The only difference between the LED module 70 shown in FIG. 8 and the LED module 10 shown in FIG. 4 is that the resistors 342 and 342 and resistors 362 and 363 in FIG. 4 are replaced by resistor networks 74 and 76, respectively.

The resistor network 74 contains resistors 741, 742, and 743, and includes terminals 744, 745, 476, and 747. The resistor 741 is a protective resistor for the FET die 341 and corresponds to the resistor 342 in FIG. 4. The series connection of the resistors 742 and 743 acts as a current sensing resistor and corresponds to the resistor 343 in FIG. 4. The terminals 744, 745, and 747 are connected to the gate of the FET die 341, the terminal 32, and the source of the FET die 341, respectively, while the terminal 746 is put in a floating state.

The resistor network 76 contains resistors 761, 762, and 763, and includes terminals 764, 765, 766, and 767. The resistor 761 is a protective resistor for the FET die 361 and corresponds to the resistor 362 in FIG. 4. The resistors 762 act as current sensing resistors and correspond to the resistor 363 in FIG. 4. The resistor 763 is just contained in the resistor network and does not serve any function. The terminals 764, 765, and 766 are connected to the gate of the FET die 361, the source of the FET die 341, and the source of the FET die 361, respectively, while the terminal 767 is put in a floating state. The resistor networks 74 and 76 are identical, and the values of the resistors 741, 742, and 743 are the same as the values of the resistors 761, 762, and 763, respectively.

Figure 9:
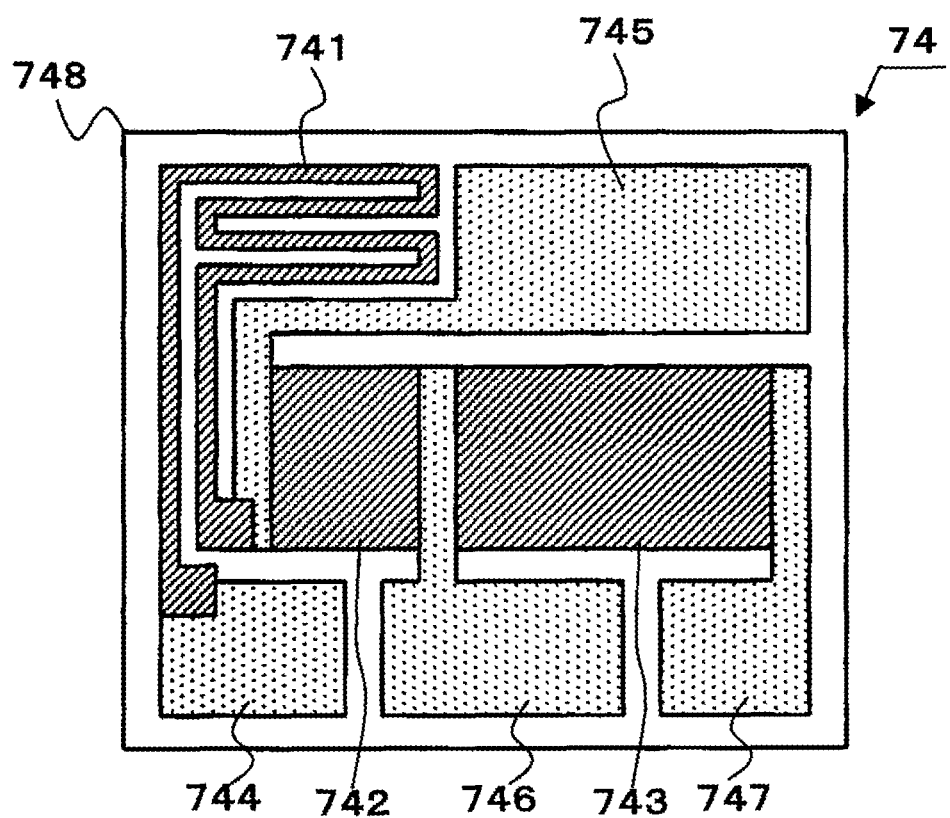
FIG. 9 is a top plan view of a resistor network 74 contained in the LED module 70.
Figure 10:
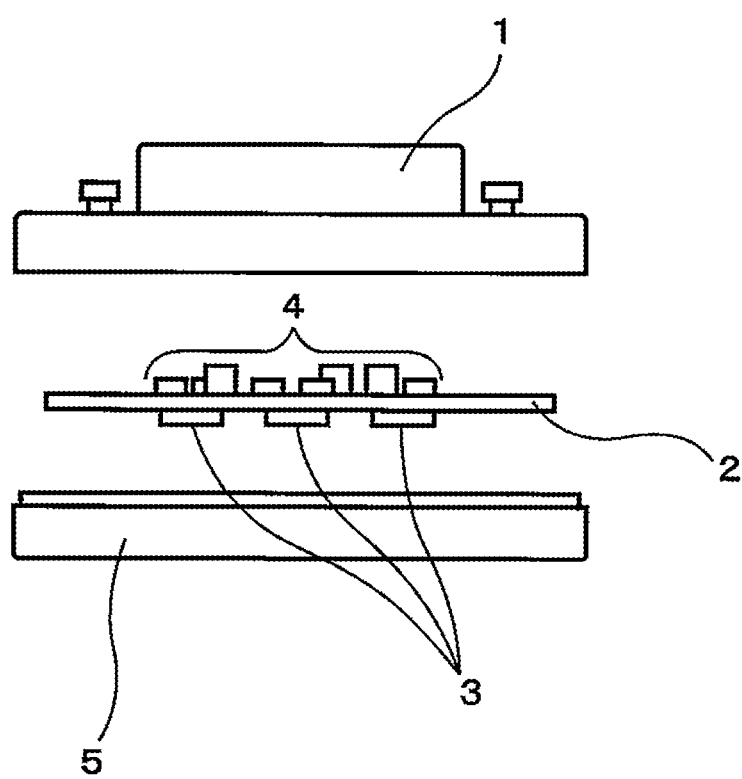
FIG. 10 is a cross-sectional view of an LED module according to a prior art example.

FIG. 9 is a top plan view of the resistor network 74 contained in the LED module 70.

The resistor network 74 is constructed by depositing TaN on a silicon substrate 748 and thus forming the resistors 741, 742, and 743 thereon, and the chip size is 0.5 mm square. The terminals 744 to 747 are disposed at the periphery of the silicon substrate 748. The terminals 744 to 747 are wiring bonding pads, and are connected to the resistors 741 to 743. The resistor 741, which is a resistor for surge protection, need only have a resistance value of about 10 kΩ to serve the purpose, and has a thin, elongated shape because it does not generate heat. On the other hand, the resistors 742 and 743, which together serve as a current sensing resistor, have a resistance value of several tens to several hundreds of ohms; since these resistors generate heat, a wide band-like shape is employed in order to increase the rated power. The resistors 742 and 743 are contained in a single band-like resistive element formed from TaN, and the resistor 742 is formed in the portion sandwiched between the terminals 745 and 746, while the resistor 743 is formed in the portion sandwiched between the terminals 746 and 747. The resistor network 76 shown in FIG. 8 is identical to the resistor network 74, and therefore will not be described herein.

The resistor networks 74 and 76 include the resistors 741 and 761 for protecting the respective FET dies 341 and 361 from surge, etc. and the current sensing resistors 742, 743, 762, and 763. However, since the resistor networks can be freely designed to provide any desired resistance values, the resistor networks 74 and 76 need not be limited to the combination of resistors shown here. When the resistor networks 74 and 76 are used that contain the surge protection resistors 741 and 761 and the current sensing resistors 742, 743, 762, and 763, the number of wire bonding sites can be reduced by one in each of the circuits, i.e., the bypass circuit 34 and the constant current circuit 36 constructed using the depletion-mode FET dies 341 and 361, respectively; this serves not only to reduce the product size and cost but also to enhance the production efficiency.

In the LED module 70, the identical resistor networks 74 and 76 are used, and the terminal to be wire-bonded is switched between the terminals 747 and 746, depending on in which circuit, the bypass circuit 34 or the constant current circuit 36, the resistor network is used. That is, the terminals 747 and 746 are bonding option pads. If it is only desired to reduce the size of the product, the two resistor networks need not be made identical, but two kinds of resistor networks, each containing a surge protection resistor and a current sensing resistor and each having a different resistance value for current sensing, may be used. However, when the resistor networks 74 and 76 are made identical and are differently connected by using a bonding option, the component management burden can be greatly reduced.

In the circuit of the LED module 10 shown in FIG. 4, the current sensing resistor 363 in the constant current circuit 36 is smaller in value than the current sensing resistor 343 in the bypass circuit 34. In view of this, the terminal 746 as the bonding option pad shown in FIGS. 8 and 9 is connected to an intermediate portion of the band-like resistive element containing the resistors 742 and 743.

In the case of the FET dies 341 and 361 which are costly and take a relatively long production time, the threshold value (the gate-source voltage for shutting off) may vary from one production lot to another. In view of this, if the resistor networks 74 and 76 which are less costly and take a shorter production time than the FET dies 341 and 361 are trimmed so as to match the characteristics of the FET dies 341 and 361, the efficiency of use of the electronic components improves.

The invention claimed is:

1. An LED module comprising:
    a circuit substrate;
    at least two supply terminals for supplying to said circuit substrate a rectified waveform voltage derived from a commercial AC power supply and arranged in corners of said circuit substrate;
    a plurality of LED dies mounted directly in bare chip form on one surface of said circuit substrate and arranged so as to form a series circuit;
    a plurality of FET dies, mounted directly in bare chip form on said one surface of said circuit substrate, for limiting current flowing through said plurality of LED dies;
    a constant current circuit mounted on said one surface of said circuit substrate and connected in series with said series circuit;
    a dam member formed on said circuit substrate so as to enclose an LED block region where said plurality of LED dies are mounted and a circuit block region where said FET die is mounted and so as to separate said LED block region from said circuit block region;

a fluorescent resin for covering said LED block region and said circuit block region, the fluorescent resin being a single material;

a resistor network mounted directly in bare chip form on said one surface of said circuit substrate; and a bypass circuit connected to an intermediate terminal provided on said series circuit, wherein said constant current circuit includes one of said plurality of said FET dies and said bypass circuit includes other of said plurality of FET dies, a portion of said dam enclosing said LED block region forms a portion of said dam enclosing said circuit block region, said dam member enclosing said LED block region has an annular shape and said dam member enclosing said circuit block region has a rectangular shape except for said portion of said dam member, and said circuit block region includes a first region which is arranged left side of said LED block region and a second region which is arranged right side of said LED block region.

2. The LED module according to claim 1, wherein said FET die is a depletion-mode device.

3. The LED module according to claim 1, further comprising a dimmer circuit, mounted on said one surface of said circuit substrate, for controlling the amount of light to be emitted from said plurality of LED dies.

4. The LED module according to claim 1, wherein said resistor network contains a protective resistor for said FET die and a current sensing resistor for said bypass circuit.

5. An LED module comprising:
a rectangular circuit substrate;
at least two supply terminals for supplying to said circuit substrate a rectified waveform voltage derived from a commercial AC power supply and arranged in corners of said circuit substrate;
a plurality of LED dies mounted directly in bare chip form on one surface of said circuit substrate and arranged so as to form a series circuit;
an FET die, mounted directly in bare chip form on said one surface of said circuit substrate, for limiting current flowing through said plurality of LED dies;
a dimmer circuit, mounted on said one surface of said circuit substrate, for controlling the amount of light to be emitted from said plurality of LED dies;
a dam formed on said circuit substrate so as to enclose an LED block region where said plurality of LED dies are mounted and a circuit block region where said FET die is mounted and so as to separate said LED block region from said circuit block region;
a fluorescent resin for covering said LED block region and said circuit block region, the fluorescent resin being a single material; and
a resistor network mounted directly in bare chip form on said one surface of said circuit substrate, wherein
a portion of said dam enclosing said LED block region forms a portion of said dam enclosing said circuit block region,
said dam member enclosing said LED block region has an annular shape and said dam member enclosing said circuit block region has a rectangular shape except for said portion of said dam member, and
said circuit block region includes a first region which is arranged left side of said LED block region and a second region which is arranged right side of said LED block region.

6. The LED module according to claim 5, further comprising a bypass circuit connected to an intermediate terminal provided on said series circuit, and wherein said bypass circuit includes said FET die.

7. The LED module according to claim 6, wherein said resistor network contains a protective resistor for said FET die and a current sensing resistor for said bypass circuit.

8. An LED module comprising:
a rectangular circuit substrate;
at least two supply terminals for supplying to said circuit substrate a rectified waveform voltage derived from a commercial AC power supply and arranged in corners of said circuit substrate;
a plurality of LED dies mounted directly in bare chip form on one surface of said circuit substrate and arranged so as to form a series circuit;
an FET die, mounted directly in bare chip form on said one surface of said circuit substrate, for limiting current flowing through said plurality of LED dies;
a dam formed on said circuit substrate so as to enclose an LED block region where said plurality of LED dies are mounted and a circuit block region where said FET die is mounted and so as to separate said LED block region from said circuit block region;
a fluorescent resin for covering said LED block region and said circuit block region, the fluorescent resin being a single material; and
a resistor network mounted directly in bare chip form on said one surface of said circuit substrate, wherein
a portion of said dam enclosing said LED block region forms a portion of said dam enclosing said circuit block region,
said dam member enclosing said LED block region has an annular shape and said dam member enclosing said circuit block region has a rectangular shape except for said portion of said dam member, and
said circuit block region includes a first region which is arranged left side of said LED block region and a second region which is arranged right side of said LED block region.

9. The LED module according to claim 8, further comprising a bypass circuit connected to an intermediate terminal provided on said series circuit, and wherein said bypass circuit includes said FET die.

10. The LED module according to claim 9, wherein said resistor network contains a protective resistor for said FET die and a current sensing resistor for said bypass circuit.

11. The LED module according to claim 10, wherein said current sensing resistor is provided with a bonding option pad.

12. The LED module according to claim 11, wherein said bonding option pad includes a pad connecting to an intermediate portion of a band-like resistive element and a pad connecting to an end portion of said band-like resistive element.

13. An LED module comprising:
a rectangular circuit substrate;
at least two supply terminals for supplying to said circuit substrate a rectified waveform voltage derived from a commercial AC power supply and arranged in corners of said circuit substrate;

a plurality of LED dies mounted directly in bare chip form on one surface of said circuit substrate and arranged so as to form a series circuit;

an FET die, mounted directly in bare chip form on said one surface of said circuit substrate, for limiting current flowing through said plurality of LED dies;

a dam member formed on said circuit substrate so as to enclose an LED block region where said plurality of LED dies are mounted and a circuit block region where said FET die is mounted and so as to separate said LED block region from said circuit block region; and a fluorescent resin for covering said LED block region and said circuit block region, the fluorescent resin being a single material, wherein a portion of said dam enclosing said LED block region forms a portion of said dam enclosing said circuit block region, said dam member enclosing said LED block region has an annular shape and said dam member enclosing said circuit block region has a rectangular shape except for said portion of said dam member, and said circuit block region includes a first region which is arranged left side of said LED block region and a second region which is arranged right side of said LED block region.

* * * * *